United States Patent [19]
Saw et al.

[11] Patent Number: 5,365,138
[45] Date of Patent: Nov. 15, 1994

[54] DOUBLE MODE SURFACE WAVE RESONATORS

[75] Inventors: John C. B. Saw, Kanata, Canada; Thomas P. Cameron, Lawrenceville, Ga.; Mark S. Suthers, Lanark, Canada; John J. Nisbet, Nepean, Canada; Samuel A. Tiller, Ottawa, Canada

[73] Assignee: Northern Telecom Limited, Montreal, Canada

[21] Appl. No.: 160,628

[22] Filed: Dec. 2, 1993

[51] Int. Cl.$^5$ ................................ H01L 41/08
[52] U.S. Cl. ...................... 310/313 D; 310/313 B
[58] Field of Search ........... 310/313 R, 313 B, 313 D; 333/150–155, 193–196

[56] References Cited

U.S. PATENT DOCUMENTS

| Re. 33,957 | 6/1992 | Nakazawa et al. | 310/313 D X |
|---|---|---|---|
| 4,542,356 | 9/1985 | Nakazawa et al. | 333/195 |
| 5,223,762 | 6/1993 | Masaie et al. | 310/313 D |

OTHER PUBLICATIONS

P. S. Cross et al., "Synchronous IDT SAW Resonators With Q Above 10,000", 1979 Ultrasonics Symposium, pp. 824–829, 1979.

M. Tanaka et al., "Narrow Bandpass Filter Using Double-Mode SAW Resonators On Quartz", 38th Annual Frequency Control Symposium, pp. 286–293, 1984.

T. Uno et al., "Optimization of Quartz SAW Resonator Structure With Groove Gratings", IEEE Trans. on Sonics and Ultrasonics, vol. SU-29, No. 6, pp. 299–310, Nov. 1982.

Primary Examiner—Mark O. Budd
Attorney, Agent, or Firm—R. John Haley

[57] ABSTRACT

A double mode surface wave resonator comprises two IDTs (inter-digital transducers), arranged side by side between reflection gratings, on a surface of a piezoelectric substrate to provide for coupling of surface waves therebetween, each IDT having interleaved electrodes extending from a common rail between the two IDTs and from a respective outer rail of the IDT. One or each of the IDTs and its outer rail is divided into two halves for providing a differential signal connection to the resonator. The electrodes of the IDTs can be arranged in spatial synchronism with adjacent fingers of the reflection gratings to reduce spurious longitudinal modes.

23 Claims, 6 Drawing Sheets

DOUBLE MODE SURFACE WAVE RESONATORS

This invention relates to double mode surface wave resonators. The term "surface wave" is used herein to embrace both surface acoustic waves (SAWs) and surface skimming bulk waves. Double mode surface wave resonators have also been referred to as waveguide coupled resonators and transversely coupled SAW resonators.

BACKGROUND OF THE INVENTION

It is known, for example from Nakazawa et al. U.S. Pat. No. 4,542,356 issued Sep. 17, 1985 and entitled "High Frequency Narrow-Band Multi-Mode Filter" and from M. Tanaka et al., "Narrow Bandpass Filter Using Double-Mode SAW Resonators On Quartz", 38th Annual Frequency Control Symposium, pages 286–293, 1984, to provide a double/node surface wave resonator in which two inter-digital transducers (IDTs) are arranged side by side in close proximity to one another on a piezoelectric substrate to provide surface wave coupling between them, each IDT also preferably being positioned longitudinally between two grounded reflector gratings via which a ground connection is made to a common bus bar or rail of the two IDTs. The outer rail of one IDT provides an input, relative to ground, of the resonator and the outer rail of the other IDT provides an output, relative to ground, of the resonator.

Such a resonator is useful as a filter at high frequencies, for example as an IF (intermediate frequency) filter in cellular radio equipment. However, the resonator provides a single-ended or unbalanced input and output, whereas in general it is preferred that radio circuits handle differential or balanced signals in order to provide better linearity and greater bandwidth. In order to use the known resonator in such balanced circuits, baluns (balanced-to-unbalanced signal transformers) are required. However, the use of baluns in large-scale manufacture is undesirable in view of issues of reliability and electromagnetic radiation. Furthermore, the relatively large size of baluns excludes them from applications using multi-chip modules. Small size is an important factor in cellular radio equipment.

It is also known, from P. S. Cross et al., "Synchronous IDT SAW Resonators With Q Above 10,000", 1979 Ultrasonics Symposium, pages 824–829, 1979, to provide a SAW resonator in which the IDT electrodes are positioned in spatial synchronism with the fingers of reflection gratings to produce a short resonant cavity which inherently suppresses spurious longitudinal modes.

An object of this invention is to provide an improved surface wave resonator, which can be used in a balanced circuit without requiring baluns.

SUMMARY OF THE INVENTION

According to one aspect of this invention there is provided a surface wave resonator comprising: a piezoelectric substrate; and two IDTs (inter-digital transducers) arranged side by side on a surface of the substrate with a common rail therebetween, so that surface waves are coupled between the IDTs, each IDT having interleaved electrodes extending from the common rail and from a respective outer rail, the outer rails providing signal connections to the resonator; wherein at least one of the IDTs and its outer rail is divided into two halves for providing a differential signal connection to the resonator.

Preferably each of the IDTs and its outer rail is divided into two halves for providing a differential signal connection to the resonator. Thus the invention provides a surface wave resonator having input and output signal connections at least one of which is balanced.

Where each of the IDTs and its outer rail is divided into two halves to provide balanced input and output signal connections, the common rail can also be divided into two halves. Alternatively, if only one of the IDTs and its outer rail is divided into two halves for providing a differential signal connection to the resonator, the outer rail of the other IDT and the common rail can provide an unbalanced signal connection to the resonator, which thereby also serves to convert between balanced and unbalanced signals.

The resonator preferably includes reflection gratings between which the two IDTs are arranged to define a resonant cavity for each IDT. The two IDTs can be separated from the reflection gratings with different separations, each of which is preferably about $0.625\lambda + n\lambda/2$, where $\lambda$, is a wavelength of a surface wave to be propagated and n is zero or a positive integer. The IDT electrodes are thereby positioned centrally relative to maxima of the standing wave potential, for optimum coupling to the substrate.

Alternatively, electrodes of one or each of the IDTs can be arranged in spatial synchronism with adjacent fingers of the reflection gratings, preferably so that the resulting resonant cavity has a length of about $0.4375\lambda + n\lambda/2$, where $\lambda$, is a wavelength of a surface wave to be propagated and n is zero or a positive integer.

According to another aspect, the invention provides a double mode surface wave resonator comprising two IDTs (inter-digital transducers), arranged side by side between reflection gratings, on a surface of a piezoelectric substrate to provide for coupling of surface waves therebetween, each IDT having interleaved electrodes extending from a common rail between the two IDTs and from a respective outer rail of the IDT, wherein at least one of the IDTs and its outer rail is divided into two halves for providing a differential signal connection to the resonator.

According to a further aspect, the invention provides a double mode surface wave resonator comprising two IDTs (inter-digital transducers), arranged side by side between reflection gratings, on a surface of a piezoelectric substrate to provide for coupling of surface waves therebetween, each IDT having interleaved electrodes extending from a common rail between the two IDTs and from a respective outer rail of the IDT, wherein electrodes of at least one of the IDTs are arranged in spatial synchronism with adjacent fingers of the reflection gratings.

BRIEF DESCRIPTION OF THE DRAWINGS

The invention will be further understood from the following description with reference to the accompanying drawings, in which.

DETAILED DESCRIPTION

Figure 1:
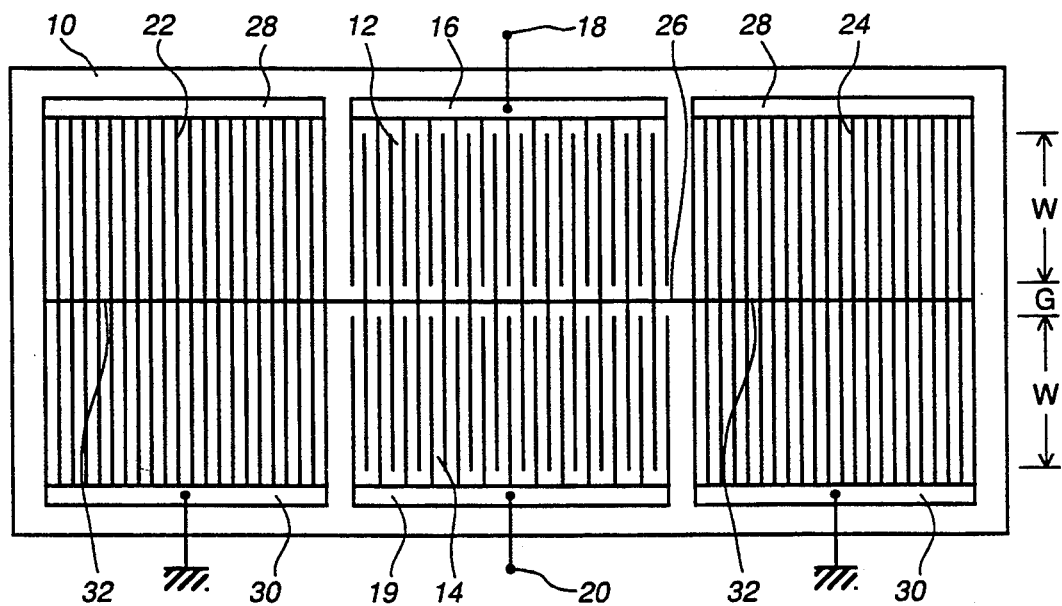
FIG. 1 schematically illustrates a known double mode SAW resonator.

Referring to FIG. 1, a double mode SAW resonator which is known from U.S. Pat. No. 4,542,356 referred to above comprises a substrate 10 of piezoelectric material on which two IDTs 12 and 14 are arranged side by side in close proximity to one another. An outer rail 16 of the IDT 12 provides a single-ended or unbalanced input (or output) connection 18, and an outer rail 19 of the IDT 14 provides a single-ended or unbalanced output (or input) connection 20, of the resonator. The IDTs 12 and 14 are positioned longitudinally between two grounded reflector gratings 22 and 24, via which a ground connection is made to a common or inner rail 26 of the IDTs 12 and 14.

Each reflector grating 22 or 24 comprises fingers which extend between one of two outer rails 28 and 30 and an inner rail 32 which is connected to and forms a continuation of the inner rail 26 of the IDTs 12 and 14. As shown in FIG. 1, the outer rails 30 are grounded; instead, or in addition, the outer rails 28 and/or the inner rails 32 can be grounded.

The IDTs 12 and 14 comprise inter-digital electrodes or fingers which have a width of $\lambda/4$ and a pitch of $\lambda/2$, where $\lambda$ is the wavelength of a SAW to be propagated, with electrodes extending from the opposite rails overlapping one another over a length W, referred to as the aperture of the IDT. The apertures of the two IDTs 12 and 14 are spaced laterally from one another by a distance G which is relatively small to provide for desired coupling of surface waves between the IDTs. The reflector gratings 22 and 24 can also comprise fingers with the same width $\lambda/4$ and pitch $\lambda/2$; this pitch can be increased or decreased to reduce the level of spurious modes in the resonator.

By way of example, the substrate 10 can comprise 36° rotated Y-cut quartz, with $\lambda$ corresponding to a centre frequency of 86 MHz. The conductive electrodes and fingers can be of aluminium having a thickness of $0.02\lambda$, with $W=10\lambda$ and $G=1.75\lambda$. Each IDT 12 or 14 can have about 360 electrodes, and each reflector grating 22 or 24 can have about 230 fingers. These parameters are given purely by way of example, and these or different parameters apply equally to all of the embodiments of the invention described below. With such numbers of electrodes and fingers, it should be appreciated that the illustrations of the electrodes and fingers in FIG. 1 and FIGS. 6 to 13 are purely diagrammatic to facilitate a full description of the various arrangements.

Figure 2:
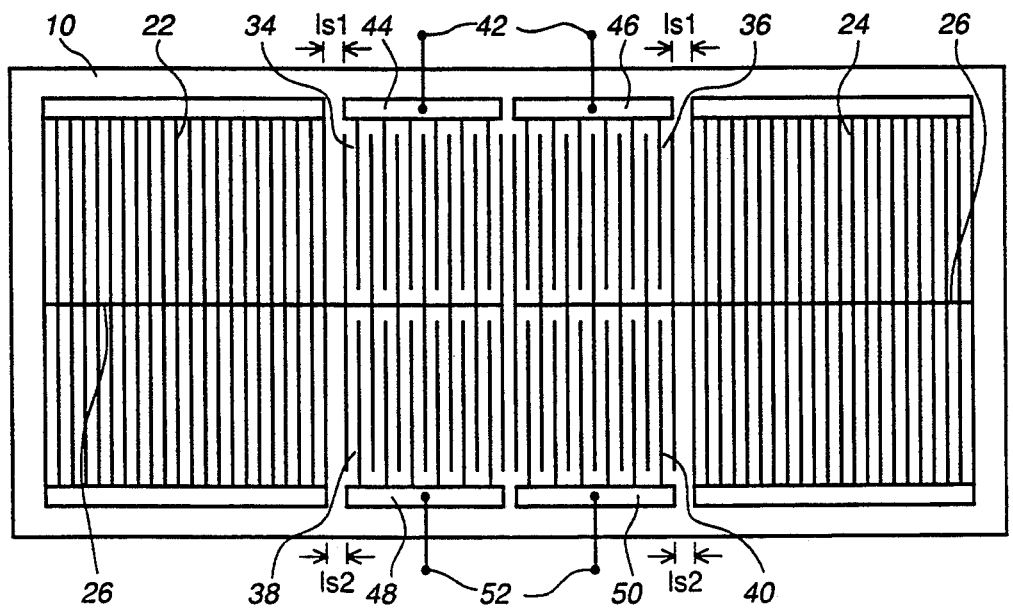
FIG. 2 schematically illustrates a double mode SAW resonator in accordance with an embodiment of the invention.

Referring now to FIG. 2, there is illustrated a double mode SAW resonator in accordance with an embodiment of the invention. The resonator includes the reflector gratings 22 and 24 on the substrate 10 generally as described above, except that in this case the reflector gratings 22 and 24 need not be grounded. The IDT 12 of FIG. 1 is divided in FIG. 2 into two differential halves 34 and 36, and the IDT 14 of FIG. 1 is divided in FIG. 2 into two differential halves 38 and 40.

As is clearly shown in FIG. 2, the electrodes of the IDT half 34 extend between the inner rail 26 and an outer rail 44, and the electrodes of the IDT half 36 extend between the inner rail 26 and an outer rail 46. The inner rail 26 is shown in FIG. 2 as being divided centrally into two halves, but this need not be the case and instead this inner rail 26 could be continuous throughout the length of the resonator. As is also shown in FIG. 2, the electrodes of the IDT halves 34 and 36 have a constant pitch of $\lambda/2$ within the two IDT halves and between the two IDT halves in the center of the resonator, but there is a phase inversion between the two halves. This is represented in FIG. 2 in that the adjacent end electrodes of the two IDT halves 34 and 36 both extend from the inner rail 26, so that the IDT halves 34 and 36 are arranged for operation with differential signals. Accordingly, differential, or balanced, signal connections 42 are provided to the rails 44 and 46.

Similarly, the electrodes of the IDT half 38 extend between the inner rail 26 and an outer rail 48, and the electrodes of the IDT half 40 extend between the inner rail 26 and an outer rail 50. The electrodes of the IDT halves 38 and 40 have a constant pitch of $\lambda/2$ within and between the two IDT halves, and there is a phase inversion between the two IDT halves 38 and 40 represented in FIG. 2 in the same manner as described above. The IDT halves 38 and 40 are thus arranged for operation with differential signals, and differential, or balanced, signal connections 52 are provided to the rails 48 and 50.

As shown in FIG. 2, the fingers of the reflector gratings 22 and 24 are spaced from the electrodes of the IDT halves 34 and 36 by separations ls1, and the fingers of the reflector gratings 22 and 24 are spaced from the electrodes of the IDT halves 38 and 40 by separations ls2. The separations ls1 and ls2 are shown the same in FIG. 2 because this is a schematic diagram, but preferably they are different in order to cancel or reduce the level of spurious and higher mode SAWs in the resonator. These separations are discussed further below with reference to FIGS. 3 and 4.

Figure 3:
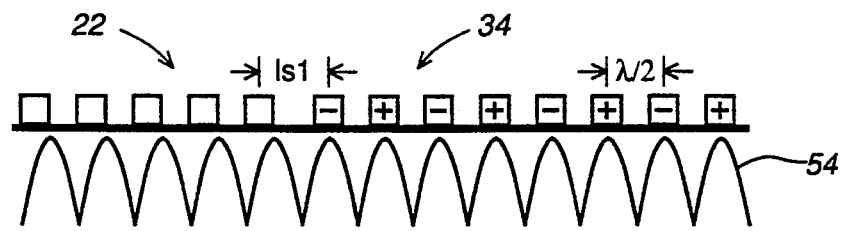
FIGS. 3 and 4 are diagrams illustrating standing wave patterns in relation to fingers or electrodes of the resonator of FIG. 2, assuming that the reflection coefficient is positive at the step-up edge of the fingers.
Figure 4:
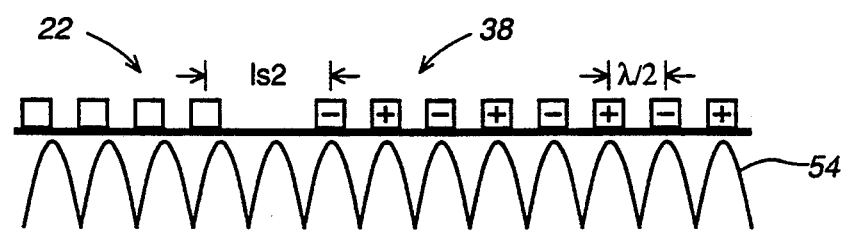

It should be appreciated that the reflector gratings 22 and 24 produce between them a gap or cavity within which SAWs determined by the IDT electrodes resonate, thereby creating a standing wave pattern. FIGS. 3 and 4 represent the standing wave pattern, referenced 54, and the positions of the electrodes of the IDT halves and the fingers of the reflection gratings in relation to this pattern. FIG. 3 illustrates electrodes of the IDT half 34, showing in conventional manner by + and − signs their relative polarities, and adjacent fingers of the reflection grating 22, also illustrating the spacing ls1. The arrangement of the electrodes of the IDT half 36 relative to the fingers of the reflection grating 24 is symmetrical to this. Similarly, FIG. 4 illustrates electrodes of the IDT half 38 and adjacent fingers of the reflection grating 22, also illustrating the spacing ls2, and a symmetrical arrangement applies to the electrodes of the IDT half 40 in relation to the fingers of the reflection grating 24.

Referring to FIG. 3, the electrodes of the IDT half 34 are centered over the standing wave maxima of the SAW potential. The fingers of the reflection grating 22 are offset from this, being positioned with an edge of each finger over the maximum of the standing wave; the illustration in FIG. 3 assumes that the SAW reflection coefficient is positive at this edge to produce constructive rather than destructive reflections. Consequently the separation ls1 is equal to $0.625\lambda$. FIG. 4 is similar except that the separation ls2 is increased by $\lambda/2$ to $1.125\lambda$. In general, each of the separations ls1 and ls2 has the form $0.625\lambda + n\lambda/2$, where n is zero or a positive integer.

Figure 5:
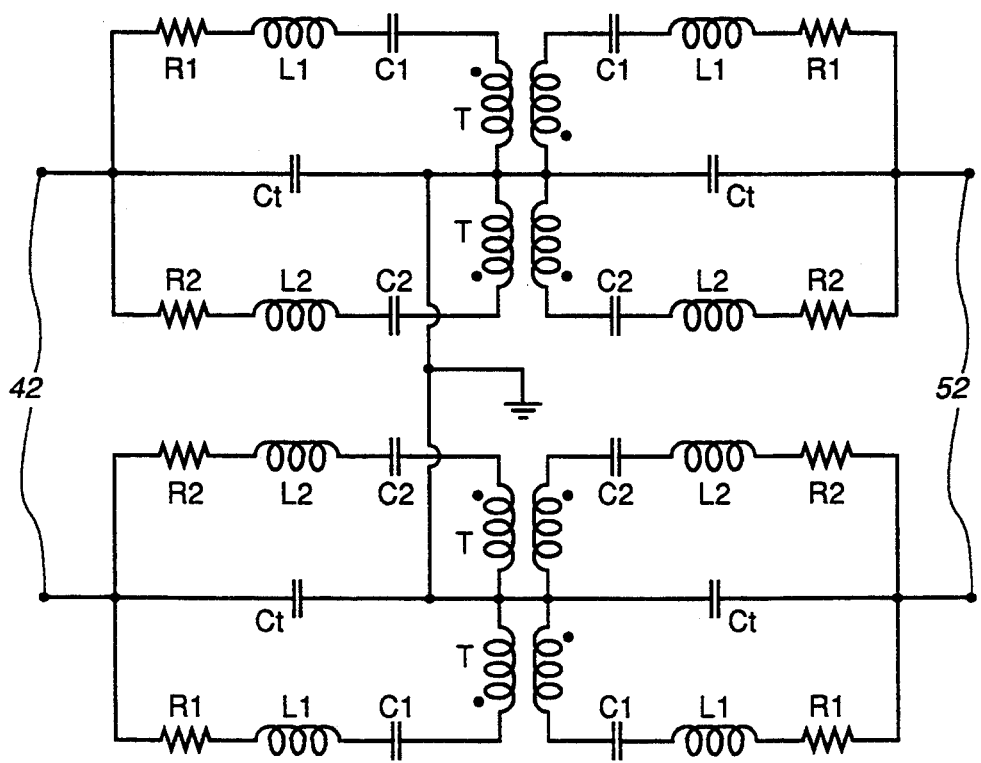
FIG. 5 schematically illustrates an equivalent circuit of the resonator of FIG. 2.

FIG. 5 illustrates an equivalent circuit of the SAW resonator of FIG. 2. In this equivalent circuit resistors R1 and R2, inductors L1 and L2, and capacitors C1 and C2 have magnitudes given by the equations $R1=Ra/4, R2=Rs/4, L1=La/4, L2=Ls/4$, $C1=4Ca$, and $C2=4Cs$, where Rs, Ls, and Cs represent the resistive, inductive, and capacitive motional (i.e. not static) components of a symmetrical vibration mode resonance frequency Fs of the resonator, and Ra, La, and Ca represent corresponding components of an anti-symmetrical vibration mode resonance frequency Fa, with coupling represented by four transformers T each with a 1:1 turns ratio and a winding sense as represented by dots in FIG. 5. Capacitors Ct represent static capacitances of the IDTs; for simplicity other static capacitances, for example between the balanced signal lines 42 and 52 at the input and output respectively, are not shown in FIG. 5.

The SAW resonator described above can for example be used as an IF (intermediate frequency) bandpass filter in a broad-band radio receiver, its balanced input 42 being coupled via a matching circuit to the balanced output of a buffer stage, and its balanced output 52 being coupled via a matching circuit to the balanced input of a noise amplifier stage. Each matching circuit can comprise a balanced arrangement of series capacitances and a shunt inductance, or series inductances and a shunt capacitance, and serves to properly terminate the SAW resonator and to compensate for the static capacitances Ct. In such an arrangement, Fs and Fa correspond to the lower and upper edges of the passband of the filter. Higher order spurious modes can be attenuated by more than 30 dB relative to the passband, and the matched insertion loss of the SAW resonator itself can be about 1.5 dB.

The positions of the electrodes and fingers shown in FIGS. 3 and 4 relative to the standing wave pattern 54 provides the strongest electromechanical coupling to the resonant cavity, but long IDTs are necessary to obtain strong coupling (i.e. low loss) on weak coupling substrates like quartz. This has the undesired effect of increasing the cavity length, which reduces the longitudinal spurious mode spacings and thus allows spurious modes to appear in the reflection grating stopbands. This effect is avoided by an alternative embodiment of the invention represented in FIG. 6, which provides inherent suppression of spurious longitudinal cavity modes.

Figure 6:
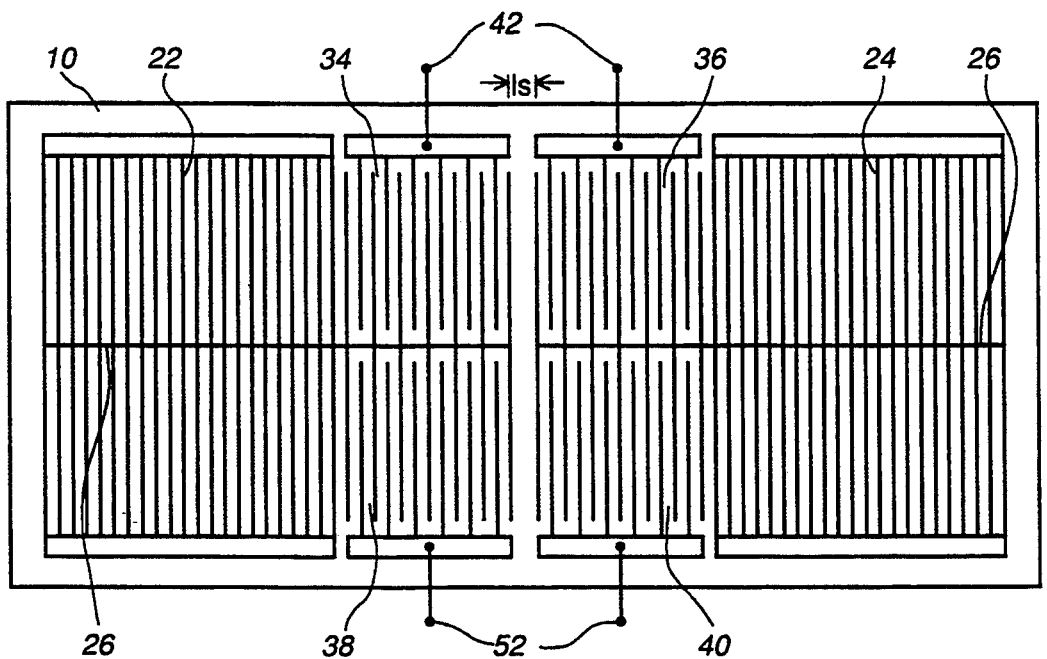
FIGS. 6 to 13 schematically illustrate double mode SAW resonators in accordance with other embodiments of the invention.

Referring to FIG. 6, the electrodes of the IDT halves 34 and 36, and the electrodes of the IDT halves 38 and 40, are displaced from the center of the SAW resonator and are positioned in spatial synchronism with the fingers of the reflection gratings 22 and 24. Thus there is a constant $\lambda/2$ pitch of the fingers and electrodes between and within the reflection grating 22 and the IDT halves 34 and 38, and between and within the reflection grating 24 and the IDT halves 36 and 40, so that the IDT electrodes constitute part of the grating arrays. The resonant cavity is then reduced to a length ls between the IDT halves, which are differentially excited as described above via the balanced signal lines 42 and 52. The shorter cavity length also makes the resonator less sensitive to fabrication variations than the arrangement of FIGS. 2 to 4.

The arrangement of FIG. 6 provides a balanced SAW resonator in which a compromise is made, depending on the separation ls, between the maximum standing wave and suppression of spurious modes. For example, a value of $ls=0.4375\lambda + n\lambda/2$, where n is zero or a positive integer, provided a desirable performance with only a slight increase in matched insertion loss of the SAW resonator itself to about 2 dB. As in the resonator of FIG. 2, in the SAW resonator of FIG. 6 the value of ls between the IDT halves 38 and 40 can be different from that between the IDT halves 34 and 36.

Figure 7:
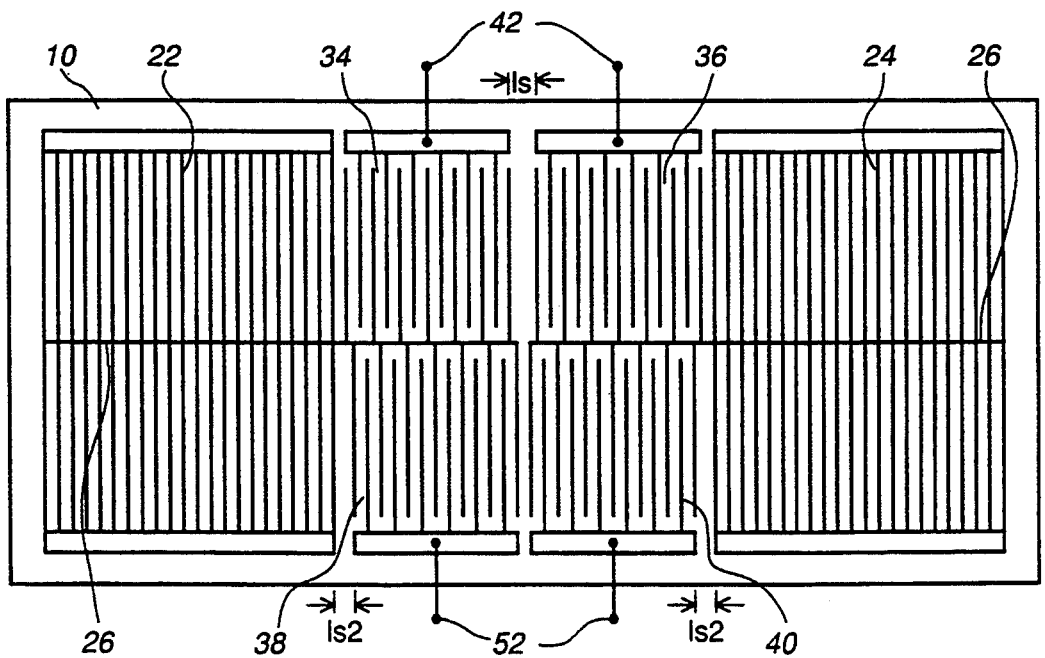

The arrangements of FIGS. 2 and 6 can be combined, for example as shown in FIG. 7. In the SAW resonator illustrated in FIG. 7, the IDT halves 34 and 36 are arranged as described above with reference to FIG. 6, and the IDT halves 38 and 40 are arranged as described above with reference to FIGS. 2 and 4.

In each of FIGS. 2, 6, and 7 the inner rail 26 is shown as being divided into two halves, but as already stated this need not be the case, and the inner rail 26 can be continuous over the entire length of the SAW resonator. In the latter case, the SAW resonator can also provide a balanced-to-unbalanced coupling, for example as described below with reference to FIGS. 8 to 11.

Figure 8:
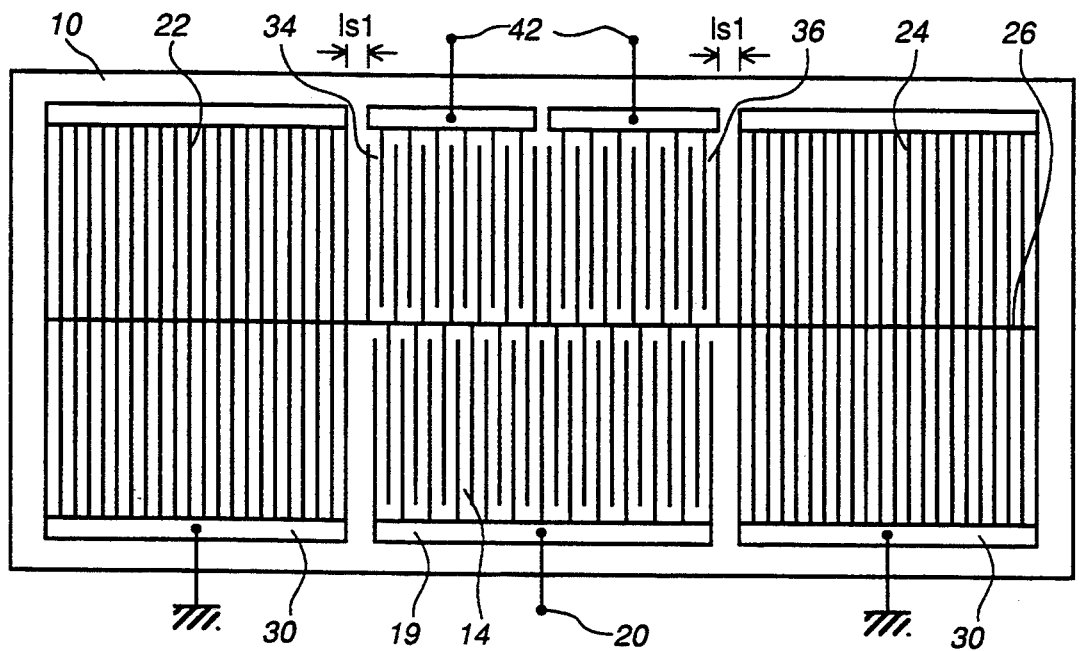

In the SAW resonator of FIG. 8, coupling is provided between the two IDT halves 34 and 36, arranged with balanced signal lines 42 as described above with reference to FIG. 2 and 3, and the IDT 14 arranged with an unbalanced signal connection 20 as described above with reference to FIG. 1.

Figure 9:
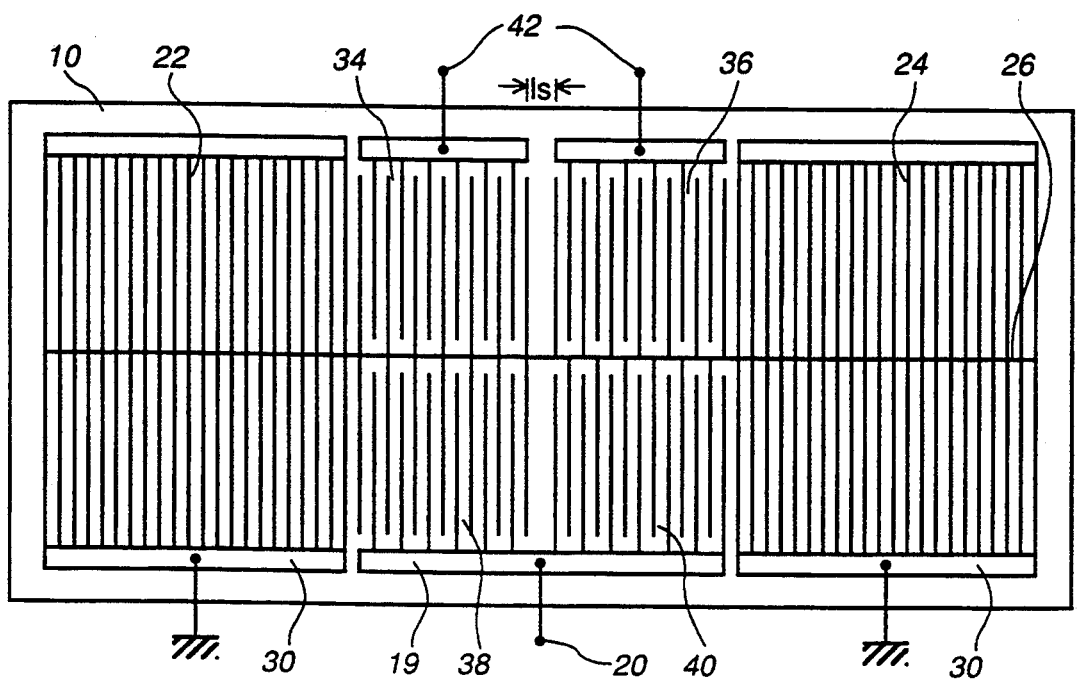

In the SAW resonator of FIG. 9, coupling is provided between the two IDT halves 34 and 36, arranged with balanced signal lines 42 as described above with reference to FIG. 6, and the IDT halves 38 and 40. In this case the IDT halves 38 and 40 are arranged in a similar manner to that shown in FIG. 6, but are both coupled to the same outer rail 19 to provide an unbalanced signal connection 20 as in the resonator of FIG. 1. Accordingly, in the resonator of FIG. 9 there is no phase inversion between the electrodes of the two IDT halves 38 and 40. Thus in FIG. 9 the electrode of the IDT half 38 which is closest to the resonant cavity, or the center of the resonator, is shown as extending from the inner rail 26, whereas the adjacent electrode of the IDT half 40 is shown as extending from the outer rail 19.

Figure 10:
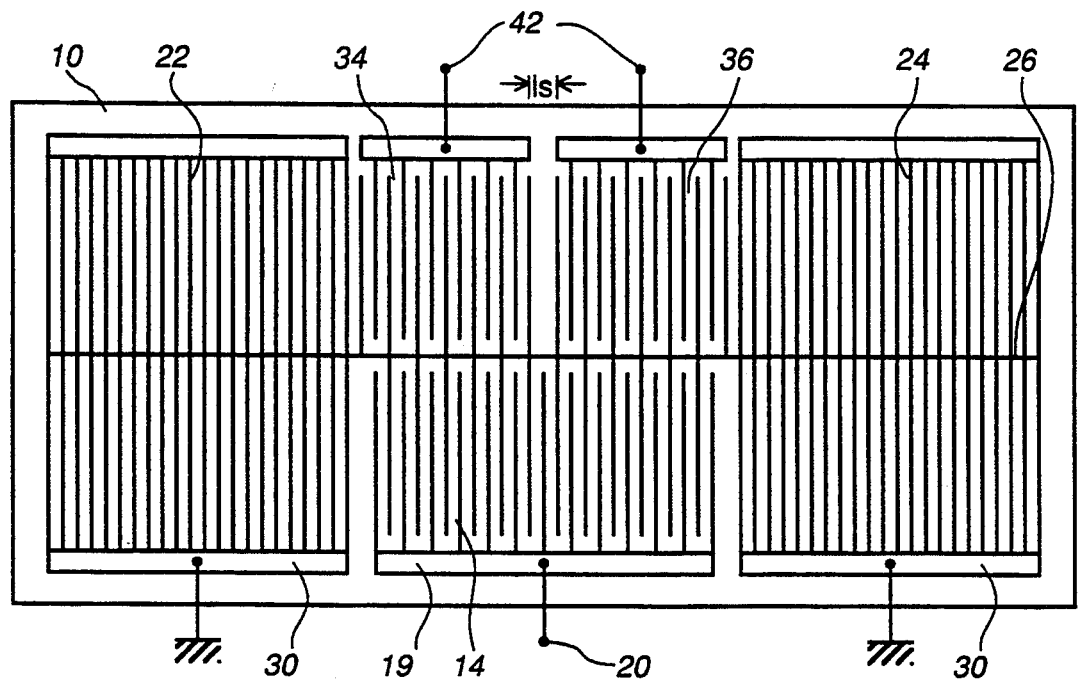

In the SAW resonator of FIG. 10, coupling is provided between the two IDT halves 34 and 36, arranged with balanced signal lines 42 as described above with reference to FIG. 6, and the IDT 14 arranged with an unbalanced signal connection 20 as described above with reference to FIG. 1.

Figure 11:
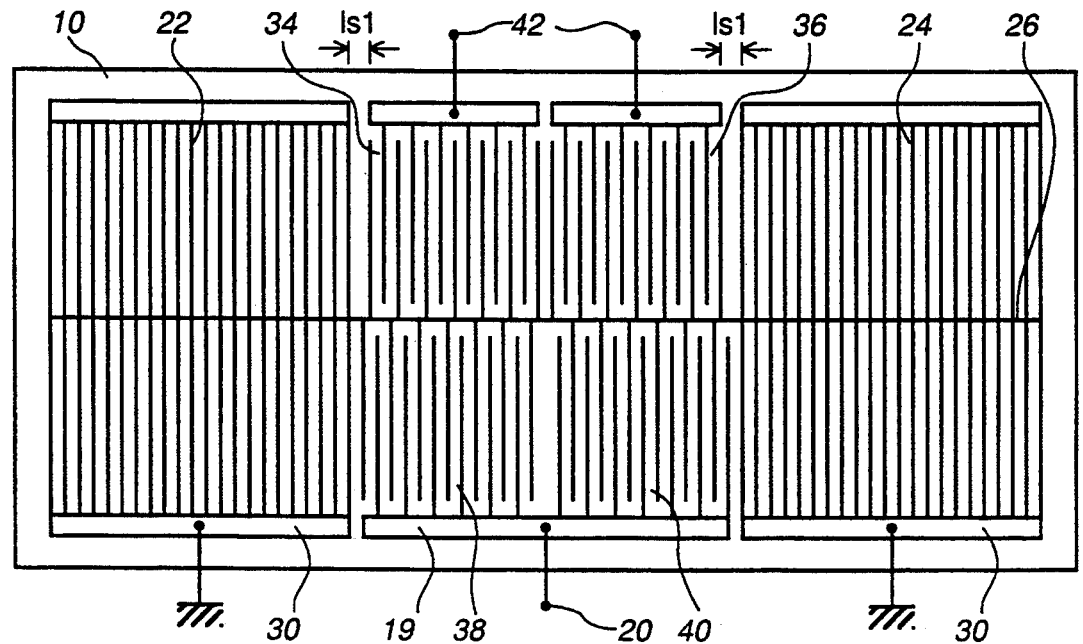

In the SAW resonator of FIG. 11, coupling is provided between the two IDT halves 34 and 36, arranged with balanced signal lines 42 as described above with reference to FIG. 2 and 3, and the IDT halves 38 and 40, arranged in the same manner as described above with reference to FIG. 9 to provide an unbalanced signal connection 20.

The advantages of the short resonant cavity provided in a SAW resonator as described above with reference to FIG. 6 can also be provided in a SAW resonator having unbalanced input and output signal connections. Such a SAW resonator may be particularly useful in circuits, such as oscillator circuits, which do not require balanced connections. Examples of such SAW resonators are illustrated in FIGS. 12 and 13.

Figure 12:
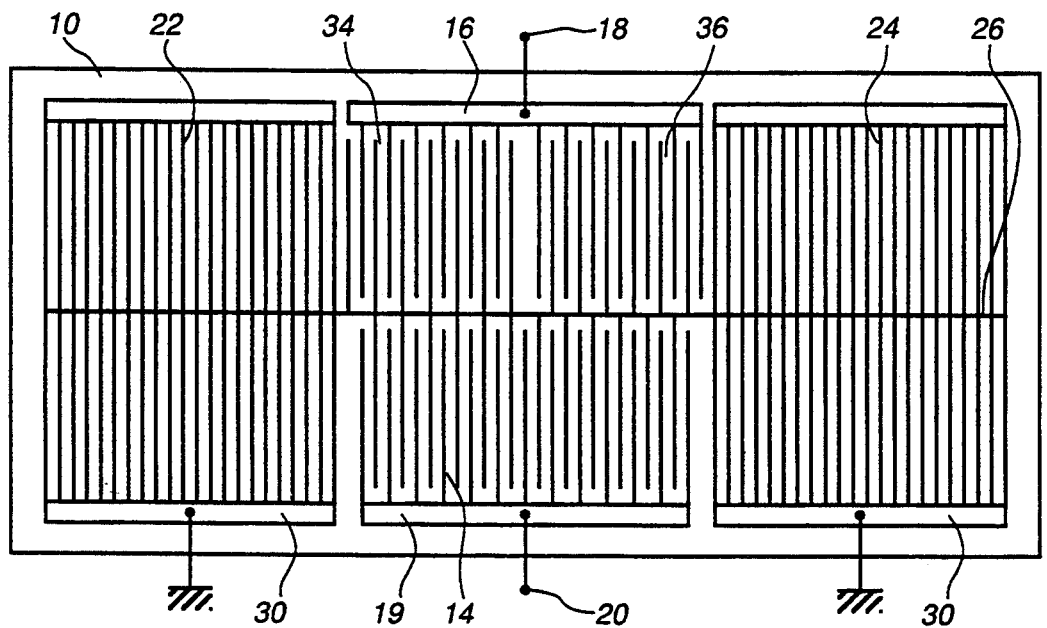

In the SAW resonator of FIG. 12, coupling is provided between the two IDT halves 34 and 36 and the IDT 14 which is as described above with reference to FIG. 1. The two IDT halves 34 and 36 are arranged with a common outer rail 16, unbalanced signal connection 18, central resonant cavity between the two IDT halves, and no phase inversion of the electrodes adjacent to this cavity, as described above for the IDT halves 38 and 40 in the resonator of FIG. 9.

Figure 13:
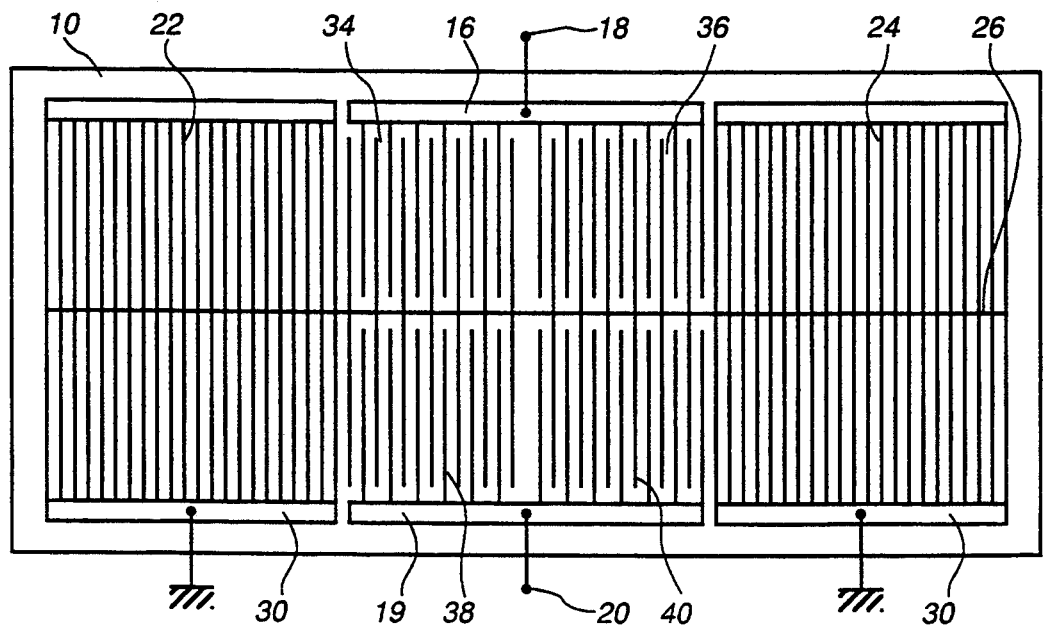

In the SAW resonator of FIG. 13, coupling is provided between the two IDT halves 34 and 36, arranged as described above with reference to FIG. 12, and the two IDT halves 38 and 40, arranged as described above with reference to FIG. 9.

Although particular embodiments of the invention have been described in detail, it should be appreciated that numerous modifications, variations, and adaptations may be made without departing from the scope of the invention as defined in the claims.

For example, although the invention has been described in relation to double mode SAW resonators, it is equally applicable to other surface wave resonators which may use surface skimming bulk waves rather than surface acoustic waves. Two or more SAW resonators may be connected in tandem, as is known in the art, in order to provide desired response characteristics, such resonators being provided either on separate substrates or on a single substrate with a desired separation between them. As already indicated, the fingers of the reflection gratings 22 and 24 can have a pitch different from that of the IDT electrodes, and as is known in the art the reflection gratings could be constituted by grooves in the substrate instead of fingers on the substrate, or could be dispensed with entirely if the IDTs are sufficiently long to provide adequate coupling between them. In addition, different sizes of the resonant cavities may be provided, and other parameters of the resonators may similarly be changed to suit particular requirements.

What is claimed is:

1. A surface wave resonator comprising:
   a piezoelectric substrate; and
   two IDTs (inter-digital transducers) arranged side by side on a surface of the substrate with a common rail therebetween, so that surface waves are coupled between the IDTs, each IDT having interleaved electrodes extending from the common rail and from a respective outer rail, the outer rails providing signal connections to the resonator;
   wherein at least one of the IDTs and its outer rail is divided into two halves for providing a differential signal connection to the resonator.

2. A surface wave resonator as claimed in claim 1 wherein each of the IDTs and its outer rail is divided into two halves for providing a differential signal connection to the resonator.

3. A surface wave resonator as claimed in claim 2 wherein the common rail is divided into two halves.

4. A surface wave resonator as claimed in claim 1 wherein only one of the IDTs and its outer rail is divided into two halves for providing a differential signal connection to the resonator, and the outer rail of the other IDT and the common rail provide an unbalanced signal connection to the resonator.

5. A surface wave resonator as claimed in claim 1 and including reflection gratings between which the two IDTs are arranged to define a resonant cavity for each IDT.

6. A surface wave resonator as claimed in claim 5 wherein each IDT is separated from an adjacent reflection grating with a separation of about $0.625\lambda + n\lambda/2$, where $\lambda$ is a wavelength of a surface wave to be propagated and n is zero or a positive integer.

7. A surface wave resonator as claimed in claim 5 wherein the two IDTs are separated from the reflection gratings with different separations.

8. A surface wave resonator as claimed in claim 5 wherein electrodes of at least one of the IDTs are arranged in spatial synchronism with adjacent fingers of the reflection gratings.

9. A surface wave resonator as claimed in claim 8 wherein electrodes of each of the IDTs are arranged in spatial synchronism with adjacent fingers of the reflection gratings.

10. A surface wave resonator as claimed in claim 8 wherein the resonant cavity for each IDT whose electrodes are arranged in spatial synchronism with adjacent fingers of the reflection gratings has a length of about $0.4375\lambda + n\lambda/2$, where $\lambda$ is a wavelength of a surface wave to be propagated and n is zero or a positive integer.

11. A surface wave resonator as claimed in claim 5 wherein each of the IDTs and its outer rail is divided into two halves for providing a differential signal connection to the resonator.

12. A surface wave resonator as claimed in claim 11 wherein the common rail is divided into two halves.

13. A surface wave resonator as claimed in claim 5 wherein only one of the IDTs and its outer rail is divided into two halves for providing a differential signal connection to the resonator, and the outer rail of the other IDT and the common rail provide an unbalanced signal connection to the resonator.

14. A double mode surface wave resonator comprising two IDTs (inter-digital transducers), arranged side by side between reflection gratings, on a surface of a piezoelectric substrate to provide for coupling of surface waves therebetween, each IDT having interleaved electrodes extending from a common rail between the two IDTs and from a respective outer rail of the IDT, wherein at least one of the IDTs and its outer rail is divided into two halves for providing a differential signal connection to the resonator.

15. A double mode surface wave resonator as claimed in claim 14 wherein each of the IDTs and its outer rail is divided into two halves for providing a differential signal connection to the resonator.

16. A double mode surface wave resonator as claimed in claim 15 wherein electrodes of at least one of the IDTs are arranged in spatial synchronism with adjacent fingers of the reflection gratings.

17. A surface wave resonator as claimed in claim 15 wherein electrodes of each of the IDTs are arranged in spatial synchronism with adjacent fingers of the reflection gratings.

18. A double mode surface wave resonator as claimed in claim 14 wherein electrodes of at least one of the IDTs are arranged in spatial synchronism with adjacent fingers of the reflection gratings.

19. A surface wave resonator as claimed in claim 14 wherein electrodes of each of the IDTs are arranged in spatial synchronism with adjacent fingers of the reflection gratings.

20. A double mode surface wave resonator comprising two IDTs (inter-digital transducers), arranged side by side between reflection gratings comprising grounded fingers, on a surface of a piezoelectric substrate to provide for coupling of surface waves therebetween, each IDT having interleaved electrodes extending from a common rail between the two IDTs and from a respective outer rail of the IDT, wherein electrodes of at least one of the IDTs are arranged in spatial synchronism with adjacent fingers of the reflection gratings.

21. A surface wave resonator as claimed in claim 20 wherein electrodes of each of the IDTs are arranged in spatial synchronism with adjacent fingers of the reflection gratings.

22. A double mode surface wave resonator comprising two IDTs (inter-digital transducers), arranged side by side between reflection gratings, on a surface of a piezoelectric substrate to provide for coupling surface waves therebetween, each IDT having interleaved electrodes extending from a common rail between the two IDTs and from a respective outer rail of the IDT, wherein the electrodes of at least one of the IDTs are divided into two groups with a resonant cavity between the groups, and the electrodes of each group are arranged in spatial synchronism with adjacent fingers of the adjacent reflection grating.

23. A surface wave resonator as claimed in claim 22 wherein the electrodes of each of the IDTs are divided into two groups with a resonant cavity between the groups, and the electrodes of each group are arranged in spatial synchronism with adjacent fingers of the adjacent reflection grating.

* * * * *